(12) United States Patent
Rao

(10) Patent No.: US 7,869,244 B2
(45) Date of Patent: Jan. 11, 2011

(54) DIGITAL MEMORY WITH CONTROLLABLE INPUT/OUTPUT TERMINALS

(76) Inventor: G. R. Mohan Rao, 800 W. Renner Rd., Apt. 1328, Richardson, TX (US) 75080

( * ) Notice: Subject to any disclaimer, the term of this patent is extended or adjusted under 35 U.S.C. 154(b) by 0 days.

(21) Appl. No.: 12/545,730

(22) Filed: Aug. 21, 2009

(65) Prior Publication Data
US 2009/0310396 A1 Dec. 17, 2009

Related U.S. Application Data

(63) Continuation of application No. 11/877,076, filed on Oct. 23, 2007, now Pat. No. 7,580,273.

(51) Int. Cl.
*G11C 5/06* (2006.01)
(52) U.S. Cl. .................... 365/63; 365/51; 365/189.05; 365/189.07
(58) Field of Classification Search ............ 365/63, 365/51, 189.05, 189.07
See application file for complete search history.

(56) References Cited

U.S. PATENT DOCUMENTS

| 5,386,394 | A | 1/1995 | Kawahara et al. |
| 6,327,203 | B1 | 12/2001 | Won |
| 6,594,170 | B2 | 7/2003 | Kudou et al. |
| 6,999,352 | B2 | 2/2006 | Yoshida et al. |
| 7,242,635 | B2 | 7/2007 | Okuda |
| 7,580,273 | B2 * | 8/2009 | Rao ........................ 365/63 |
| 2002/0186717 | A1 | 12/2002 | Haq et al. |
| 2003/0133527 | A1 | 7/2003 | Joo et al. |
| 2003/0174544 | A1 | 9/2003 | Kim |
| 2004/0065904 | A1 | 4/2004 | Yoshida et al. |
| 2006/0071687 | A1 | 4/2006 | Kim |
| 2006/0176040 | A1 * | 8/2006 | Kernahan et al. ........ 323/299 |
| 2007/0070671 | A1 | 3/2007 | Richter |

OTHER PUBLICATIONS

Micron, "512Mb: ×4, ×8, ×16 DDR2 SDRAM Features" 2004, pp. 1-133.
International Search Report and Written Opinion mailed Mar. 3, 2009 for PCT/US2008/080788.
Notice of Allowance mailed Apr. 14, 2009 for U.S. Appl. No. 11/877,076, filed Oct. 23, 2007.

* cited by examiner

*Primary Examiner*—Son Dinh
(74) *Attorney, Agent, or Firm*—Schwabe, Williamson & Wyatt, P.C.

(57) ABSTRACT

Methods and apparatus for controlling an input/output (I/O) driver of an I/O terminal based at least in part on the values being provided to the I/O terminal is disclosed. In various embodiments, a detector is employed. The detector shuts off power to the I/O driver if the digital value being presented is the same as a previously presented digital value.

29 Claims, 7 Drawing Sheets

DIGITAL MEMORY WITH CONTROLLABLE INPUT/OUTPUT TERMINALS

RELATED APPLICATIONS

This application is a continuation of prior application Ser. No. 11/877,076, filed Oct. 23, 2007 and claims priority to said application Ser. No. 11/877,076 under 35 U.S.C. §120. Further, application Ser. No. 11/877,076 is hereby incorporated by reference herein in its entirety.

FIELD OF THE DISCLOSURE

Embodiments of the disclosure relate to integrated circuits, in particular to digital memory devices with controllable input/output terminals.

BACKGROUND OF THE DISCLOSURE

Electronic systems are used in numerous devices including Personal Computers (PC), servers, routers, hubs, switches, line cards, cellular telephones, Personal Data Assistants (PDA), electronic gaming devices, High Definition Televisions (HDTV), as well as industrial devices, automotive devices, and others. The primary technology drivers for these electronic systems are digital logic and control, semiconductor memory, Input/Output (I/O) and mixed signal (analog and digital) technologies. Examples of stand alone products include micro processors/controllers, Dynamic Random Access Memory (DRAM), SRAM, flash EEPROM, A/D converters etc. Examples of embedded products include multiple integrated circuits (IC) as SIC (System-In-Chip) or monolithic IC as SOC (System-On-Chip).

For well over three decades, semiconductor memories such as DRAM's, SRAM's, ROM's, EPROM's, EEPROM's, Flash EEPROM's, Ferroelectric RAM's, MAGRAM's and others, have played a vital role in many electronic systems. Their functions for data storage, code (instruction) storage, and data retrieval/access (Read/Write) continue to span a wide variety of applications. Usage of these memories in both stand alone/discrete memory product forms, as well as embedded forms such as, for example, memory integrated with other functions like logic, in a module or monolithic IC, continues to grow. Cost, operating power, bandwidth, latency, ease of use, the ability to support broad applications (balanced vs. imbalanced accesses), and nonvolatility are all desirable attributes in a wide range of applications.

With low voltage and battery operation becoming mandatory for portability, significant strides have yet to be made towards reducing I/O power consumption. Unlike sophisticated work stations, a portable electronic device usually only has one or two processing units on a chip with one or two memory components. Under such situation, toggling the input/output (I/O) values takes 30%-50% of the total power consumption of the chip.

In commercially available memory devices, the system toggles each bit inputted or outputted in each input/output (I/O) cycle to I/O terminals of the memory devices. This means the dynamic power consumed during each I/O cycle is relatively constant during each I/O cycle with all else being the same in terms of device operation and the number of I/O terminals heavily affects the dynamic I/O power consumption. In U.S. Pat. No. 6,999,352 "Data Inversion Circuit and Semiconductor Device" dated Feb. 14, 2006 issued to Yoshida et al., a data inversion method to save I/O dynamic power is disclosed. This method is for reading operation. The current data to be outputted in a current cycle and the previously outputted data from a previous cycle are compared. If the majority of data bits (N/2 or more of N bits) are to be changed, then the data bits of the current cycle will be inverted to output the resulting data bits, such as to reduce the number of bits of data actually changed on the external bus (to N/2 bits or less), thereby reducing the noise and power consumption. An inversion bit is also set indicating that the data has been inverted. However, there is no teaching or suggestion within Yoshida for solutions with regards to writing operations, nor is there a teaching or suggestion within Yoshida with regard to saving power while inputting address values. Also, the method of Yoshida does not teach or suggest solutions for saving power when a minority number (less than N/2) of the data bits are to be changed.

BRIEF DESCRIPTION OF THE DRAWINGS

Embodiments of the disclosure will be readily understood by the following detailed description in conjunction with the accompanying drawings. Embodiments of the disclosure are illustrated by way of example and not by way of limitation in the figures of the accompanying drawings.

DETAILED DESCRIPTION

Figure 1:
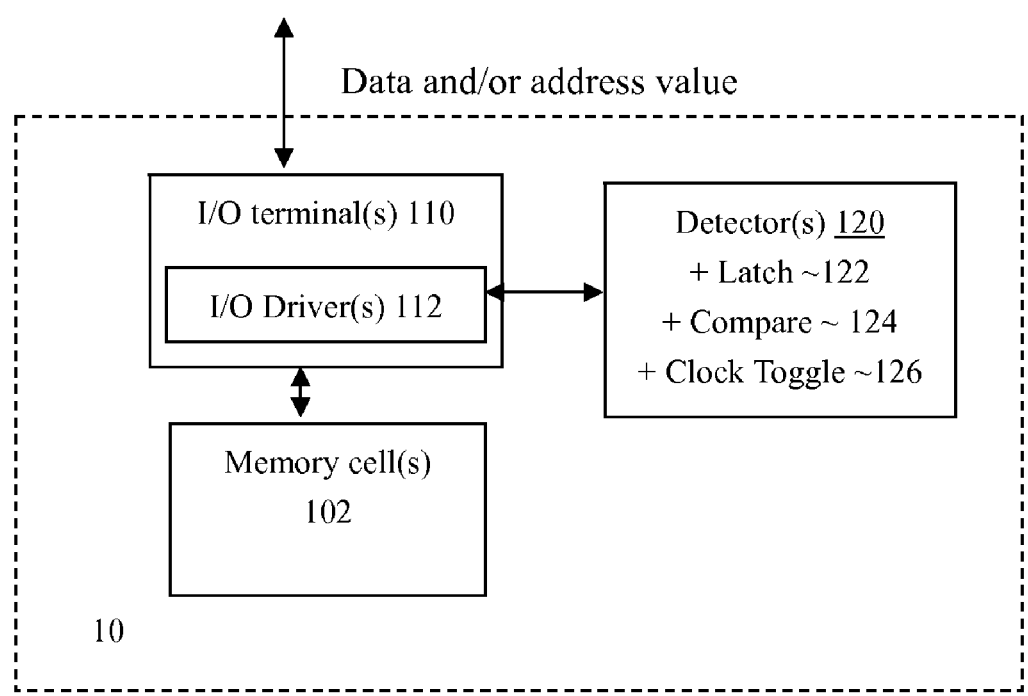
FIG. 1 shows a block diagram of a digital memory unit in accordance with embodiments.

In the following detailed description, reference is made to the accompanying drawings which form a part hereof wherein like numerals designate like parts throughout, and in which are shown, by way of illustration, specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

In the following detailed description, reference is made to the accompanying drawings which form a part hereof, and in which is shown by way of illustration embodiments of the disclosure. It is to be understood that other embodiments may be utilized and structural or logical changes may be made without departing from the scope of the disclosure. Therefore, the following detailed description is not to be taken in a limiting sense, and the scope of embodiments in accordance with the disclosure is defined by the appended claims and their equivalents.

Various operations may be described as multiple discrete operations in turn, in a manner that may be helpful in understanding various embodiments; however, the order of description should not be construed to imply that these operations are order dependent. Also, embodiments may have fewer operations than described. A description of multiple discrete operations should not be construed to imply that all operations are necessary.

The terms "coupled" along with its derivatives, may be used. It should be understood that these terms are not intended as synonyms for each other. Rather, in particular embodiments, "coupled" may mean that two or more elements are in direct physical or electrical contact. However, "coupled" may also mean that two or more elements are not in direct contact with each other, but yet still cooperate or interact with each other.

The description may use the phrase, "various embodiments," "in an embodiment," or "according to one embodiment," which may each refers to one or more of the same or different embodiments. Furthermore, the terms "comprising," "including," "having," and the like, as used with respect to embodiments as described in the present disclosure, are synonymous.

In order to meet the growing demands placed on digital memory devices, a need has arisen to reduce power consumed by digital memory. Embodiments of the present invention with controllable I/O terminals may reduce I/O dynamic power for writing and/or reading operations, for driving address as well as data values.

Various embodiments may employ one or more operating circuits such as detectors to conditionally control operation of the I/O terminals of a digital memory unit, to affect the amount of I/O dynamic power consumed by the digital memory unit. Each detector may enable or disable one or more I/O drivers of an I/O terminal of the digital memory unit when certain criteria is met, thereby reducing the amount of I/O dynamic power consumed by the digital memory unit. The conditions may include whether the same digital values are being presented to the I/O terminals. The digital values may be address and/or data values. The detector may include one or more latches to hold the digital values previously provided to the I/O terminal, and comparison circuitry to compare one of the previous provided digital values, e.g. the immediately preceding digital value, to the digital value currently presented to the I/O terminal. A detector may include a clock toggle switch to perform the enabling and disabling of an I/O driver. As used herein, a clock toggle switch may be a device clocked or controlled by a clock for its intended operation. Due to its being controlled by a clock, it may be non-static. It may, in embodiments, be clocked or controlled by more than one clock. Such a device may, in embodiments, be a flip flop or other component.

A detector may control the operation of only one I/O driver of an I/O terminal, multiple or all I/O drivers of an I/O terminal, one I/O driver each of a plurality of I/O terminals, or a plurality of I/O drivers of a plurality of I/O terminals.

According to various embodiments, FIG. 1 shows a memory bank 10 having m memory cells 102 and n I/O terminals 110 coupled to each other. Typically, m and n are integers with n smaller than m. Memory cells 102 and I/O terminals 110 are configured to perform the conventional functions of storing digital data, and inputting and/or outputting digital values to and from the memory cells 102 respectively. Inputting digital values may include address values addressing the memory cells 102 or data values to be written into the addressed memory cells 102, whereas outputting digital values may include data being output from the memory cells 102. Typically, an I/O terminal 110 is used to input digital values at times and output digital values at other times. However, in some embodiments, one or more I/O terminals 110 may be dedicated for inputting or outputting digital values. In other words, for these embodiments, these dedicated I/O terminals 110 are configured as either input terminals or output terminals. Thus, the term "I/O terminal", for the purpose of this application, including the claims, shall have the meaning encompassing terminals used for both input and output, and terminals used for only input or output. It will also be understood by one of ordinary skill that I/O terminal may be synonymous or similar to the terms "I/O pin" and "I/O pad". I/O terminal, as used in this description, may encompass a broad range of input/output components used in various electronic devices such as integrated circuits, including, in embodiments, devices adapted to receive input from, or send output to, external electrical media or devices and may, in embodiments, include components having one or more I/O drivers for driving digital values input or output to or from an electronic device.

In various embodiments, each I/O terminal 110 includes a number of I/O drivers 112 to drive the digital values being inputted or outputted, e.g. two I/O drivers, an input driver and an output driver, to respectively drive input and output values at the I/O terminal 110 (at different times). An I/O driver may drive one voltage level to denote one digital value (e.g. "0"), another voltage level do denote another digital value (e.g. "1").

Additionally, memory bank 10, in accordance with teachings of the present disclosure may include one or more operating circuits, such as detector(s) 120. Each detector 120 as illustrated, is coupled to at least one I/O driver 112 of at least one I/O terminal 110 to conditionally control operation of the coupled I/O driver(s) 112, in particular, to disable the I/O driver 112 from driving an input or an output digital value, e.g. by shutting power off to the I/O driver 112.

In various embodiments, as illustrated, a detector 120 may include one or more latches 122 to hold one or more digital values previously inputted/outputted by I/O terminal 110, and comparison circuitry 124 to compare a previously presented digital value (e.g. the immediately preceding digital value) with a current digital value to be driven. For the embodiments, detector 120 may further include one or more clock toggle switches 126 to provide or shut off power to the coupled I/O driver(s) 112.

Figure 3:
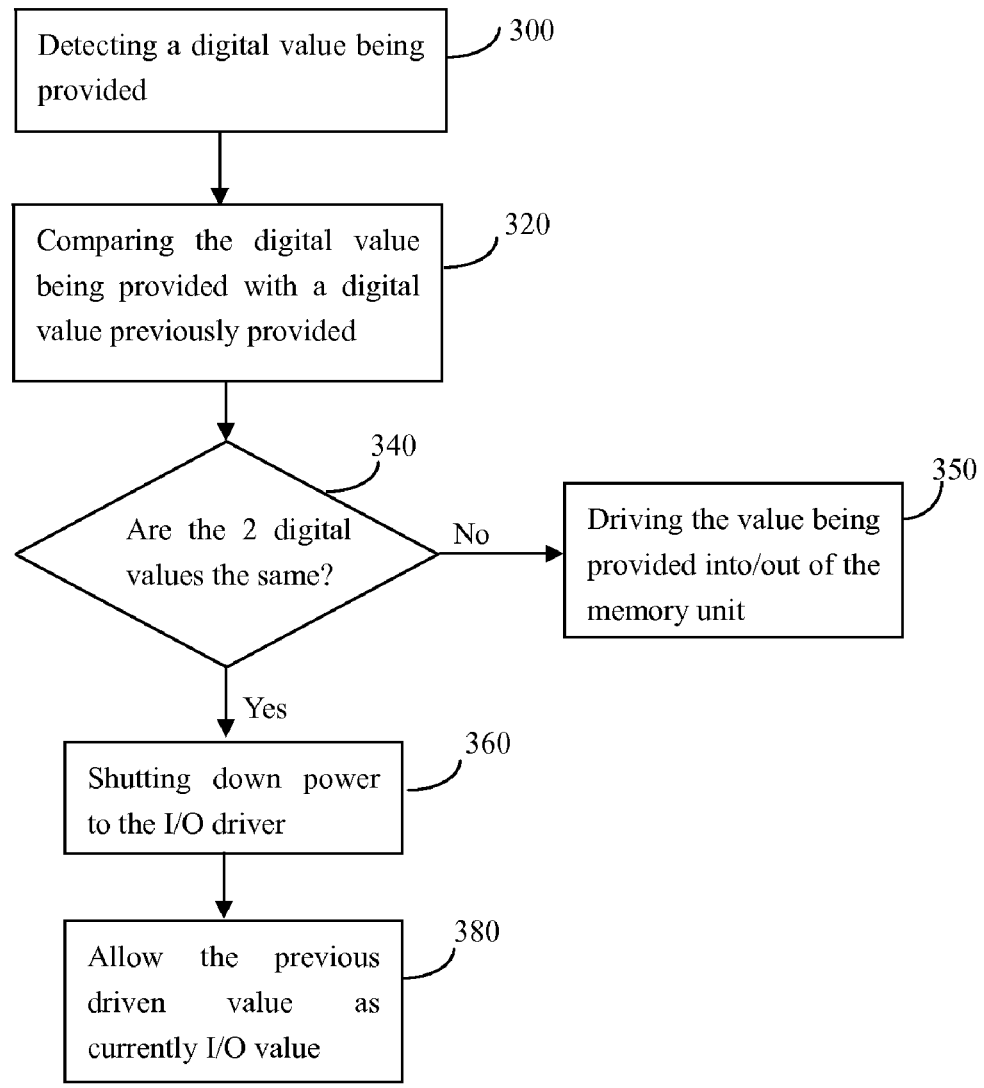
FIG. 3 shows a flow chart of a method for operating a digital memory unit according to embodiments.

FIG. 3 shows a flow chart that depicts a method to control I/O operations of a memory unit according to various embodiments. At 300 the detector may detect the digital value being provided to an I/O terminal. As described earlier, this may be an input digital value or an output digital value, and for the former case, the digital value may be an address value or a data value. The detector may be able to detect the digital value because the digital values are usually provided half a cycle early. At 320, the detector may compare the digital value being provided with a digital value which was provided to the I/O terminal previously. In embodiments, the previously provided value may have been provided during an immediately previous I/O cycle. In alternative embodiments, the previously provided value may have been provided during an I/O cycle that did not immediately precede the current I/O cycle. The previous digital value may be held by the detector for the comparison at 320. At 340, the detector may determine the relationship between the two digital values. If they are the same, then at 360 the detector may shut off power to the I/O driver and at 380, allowing the previously driven digital value to be used as the current digital value. Since the I/O driver may be shut down before the desired level necessary to drive the current digital value is achieved, power consumed by the I/O driver to pull or drag the voltage to the desired level may be reduced when the two digital values are the same. In various embodiments, the power consumed may be reduced to 40%-75% of prior art digital memory units, in particular to 50%-60%. However, if the two digital values are different, then the previously driven value and the current value to be driven, may be determined to be different, and the detector may allow power to be continued to be provided to the I/O driver, enabling the I/O driver to complete driving the voltage to the desired level at 350 and the digital value being provided at the I/O terminal may be inputted/outputted to and from the memory unit.

Figure 2:
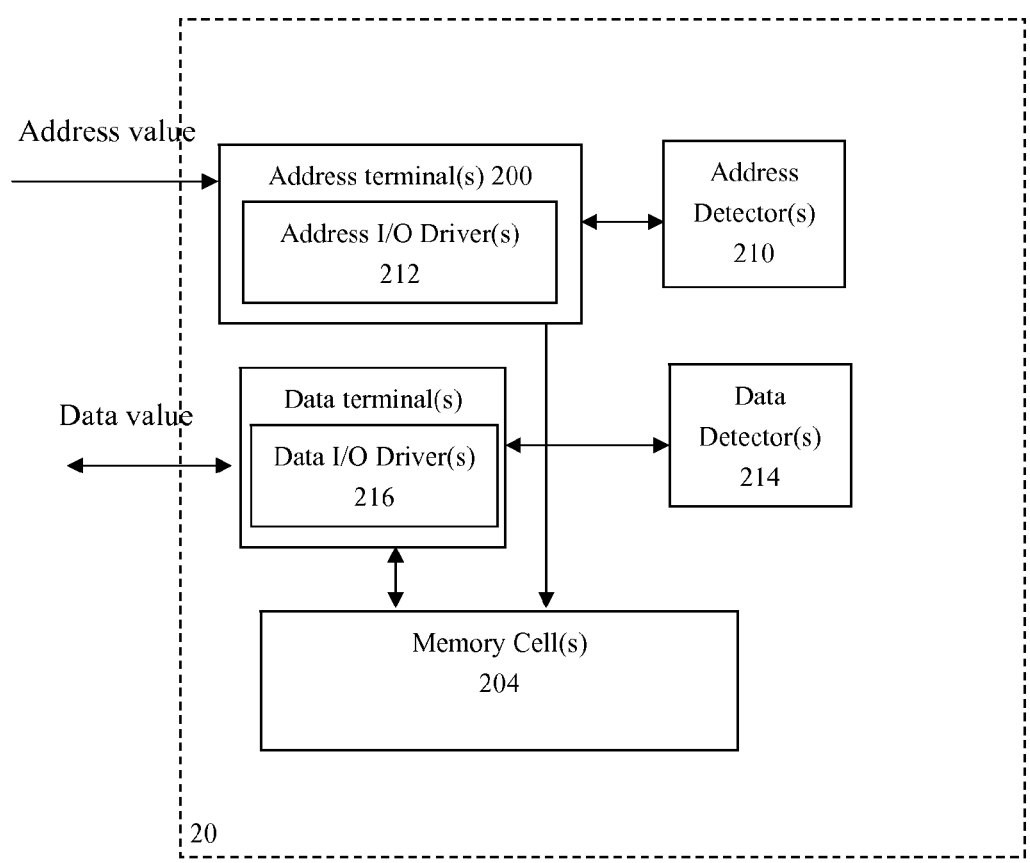
FIG. 2 shows a block diagram of another digital memory unit including both data and address input/output in accordance with embodiments.

FIG. 2 shows various alternate embodiments, where memory bank 20 employs separate I/O terminals 200 and 202 to drive I/O address values and I/O data values. As with the embodiments of FIG. 1, the address and data I/O terminals 200 and 202 are coupled to the memory cells 204. And the address and data I/O terminals 200 and 202 may include drivers 212 and 216. In the case of address I/O terminals 200, each may comprise as few as one I/O driver for driving an address value for the memory cells 204, whereas for data I/O terminals 202, each may comprise one or more, e.g. two, for driving input and output digital values (at different times). As before, the drivers 212 and 216 may drive one voltage level to denote one digital value (e.g.: "0") and another voltage level to denote another digital value (e.g. "1").

Memory bank 20 may further comprise a number of operating circuits, in particular, at least one address detector 210 and at least one data detector 214 to conditionally control operation of the I/O drivers of address terminals 200 and data terminals 202 respectively. In various embodiments, one address detector 210 is employed to control operation of all drivers 212 of the address terminals 200. In other embodiments, multiple address detectors 210 are employed, with each address detector 210 controlling the operation of one driver 212 of one address terminal 200. In various embodiments, one data detector 214 is employed to control the operation of all drivers 216 of the data terminals 202. In other embodiments, multiple data detectors 214 are employed, with each data detector 214 controlling the operation of one driver 216 of one data terminal 202.

Figure 4:
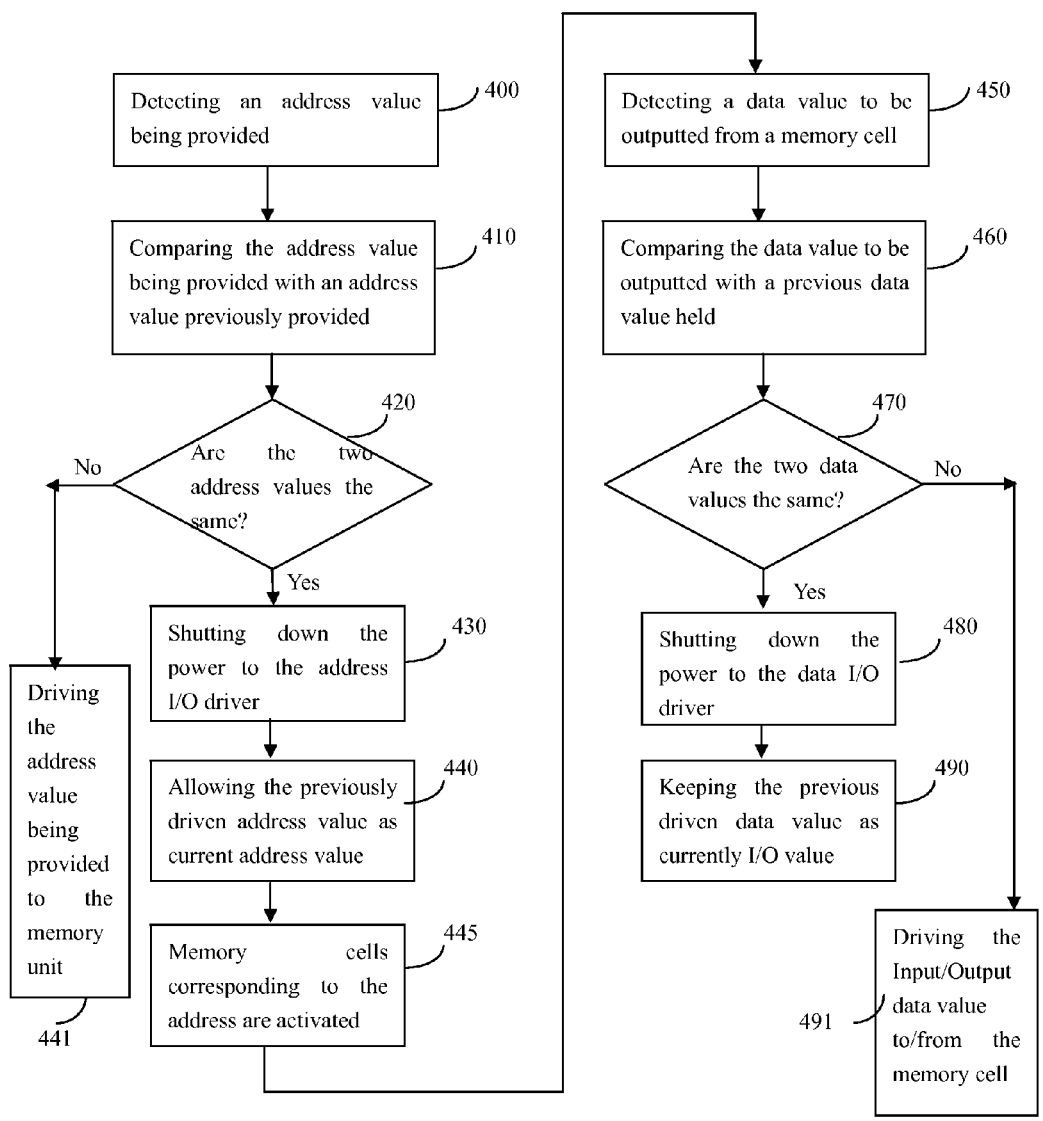
FIG. 4 shows a flow chart of another method for operating a digital memory unit according to embodiments.

FIG. 4 shows a flow chart of a method to control the operation of I/O operations of a memory unit according to various embodiments. At 400, the address detector may detect the address value being provided at an address terminal of the memory unit and then, at 410, it may compare it with another address value previously provided. At 420, the address detector may determine the relationship between the two address values. If they are the same, then at 430 the address detector may shut off power to the address I/O driver and at 440 allow the previously driven address value to be used as the current address value. However, if the two address values are different, then the address detector may allow power to be provided to the address I/O driver, allowing the address I/O driver to complete driving the voltage on the address bus to the desired level at 441. The whole address may correspond to particular memory cells within the memory bank with data to be written into or outputted from the memory bank. At 445, the memory cells may be activated to accept the data values being written or have their stored data values sensed for output. Upon such sensing, at 450, a data detector may detect the data value of one or more of the particular memory cells to be written or outputted. At 460, the data detector may compare the data value to be written into or outputted from, with a previously driven data value held by the data detector. In embodiments, the data value held by the data detector may have been previously written into or read from the same memory cells during an earlier write/read access cycle of the memory bank. In other embodiments, the data value held by the data detector may have been previously written to the same or read from the memory cell during an earlier write access cycle of the memory bank. At 470, the data detector may determine the relationship between the two data values. If they are the same, then at 480 the data detector may shut off power to the data I/O driver and at 490 allowing the previously written into or read out data value to be used as the current write/output data value. However, if the two data values are different, then the data I/O driver may complete driving the voltage to the desired data voltage level at 491.

Figure 5:
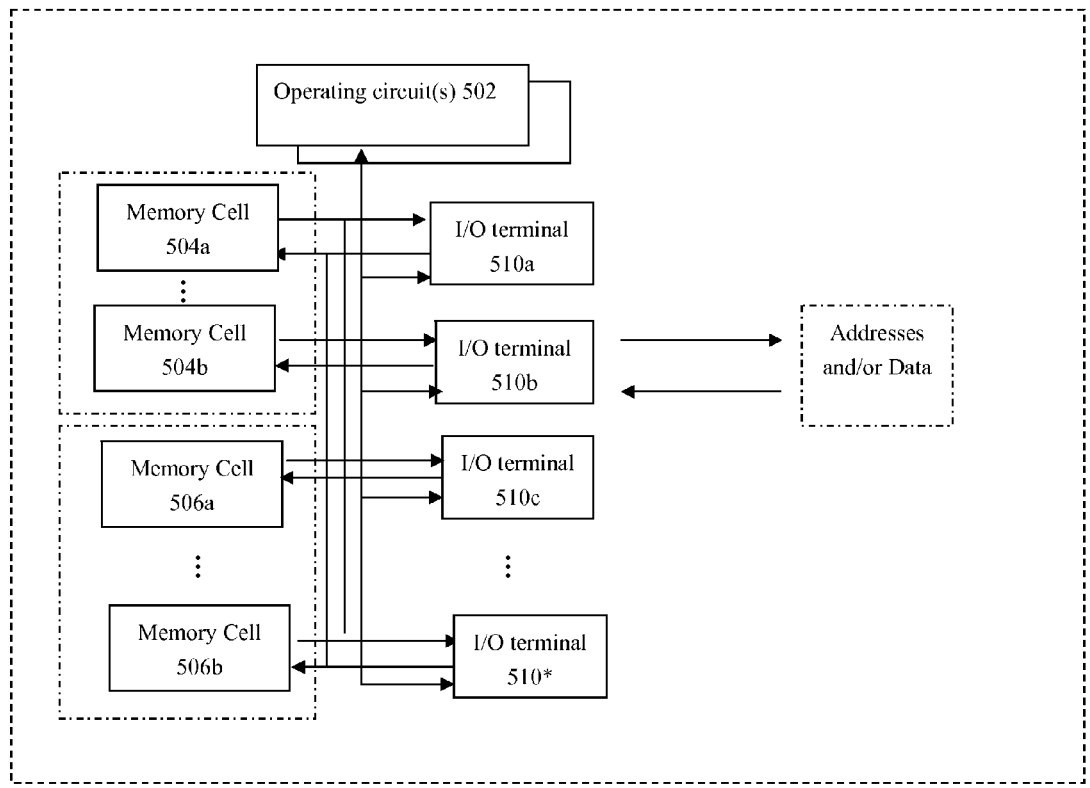
FIG. 5 shows a block diagram of a digital memory unit with multiple clusters of digital memory cells according to embodiments.

FIG. 5 shows a system which comprises a digital memory bank with multiple clusters of memory cells, and multiple I/O terminals and operating circuits, shared across the clusters of memory cells, in accordance with various embodiments. As described earlier, the cluster of memory cells 504* and 506*, and the I/O terminals 510* (* denoting any of the "subscripts", "a", "b" . . . etc.) are configured to perform their conventional functions of storing digital values, and for facilitating writing and reading digital values into and/or out from the memory cells. For the embodiments, operating circuits 502 comprise detectors as described earlier, are employed to conditionally control operation of the I/O terminals 510, to enable I/O dynamic power consumed to be substantially reduced.

Figure 6:
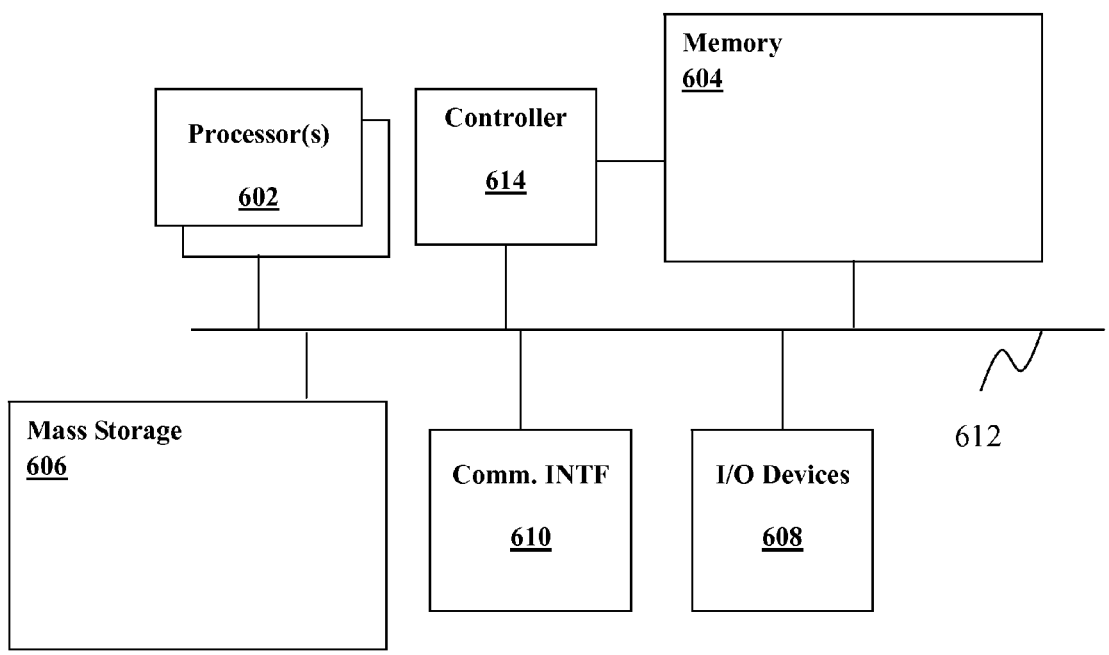
FIG. 6 shows a block diagram of a computer system with one or more digital memory units according to embodiments.

FIG. 6 illustrates an example computing system/device suitable for use to practice various digital memory devices incorporating embodiments of the present invention. As shown, computing system/device 600 may include one or more processors 602, and system memory 604, such as for example digital memory device 10 and 20 of FIGS. 1 and 2. Additionally, computing system/device 600 may include mass storage devices 606 (such as diskette, hard drive, CDROM and so forth), input/output devices 608 (such as keyboard, cursor control and so forth) and communication interfaces 610 (such as network interface cards, modems and so forth). The elements may be coupled to each other via system bus 612, which represents one or more buses. In the case of multiple buses, they may be bridged by one or more bus bridges (not shown). All or portion of system memory 604 may be endowed with all or portions of the teachings of the present invention, earlier described.

Other than the teachings of the various embodiments of the present invention, each of the elements of computer system/device 600 may perform its conventional functions known in the art. In particular, system memory 604 and mass storage 606 may be employed to store a working copy and a permanent copy of programming instructions implementing one or more software applications.

Although FIG. 6 depicts a computer system, one of ordinary skill in the art will recognize that embodiments of the present invention may be practiced using other devices that utilize DRAM or other types of digital memory such as, but not limited to, mobile telephones, Personal Data Assistants (PDAs), gaming devices, high-definition television (HDTV) devices, appliances, networking devices, digital media players, laptop computers, portable electronic devices, telephones, as well as other devices known in the art.

Figure 7:
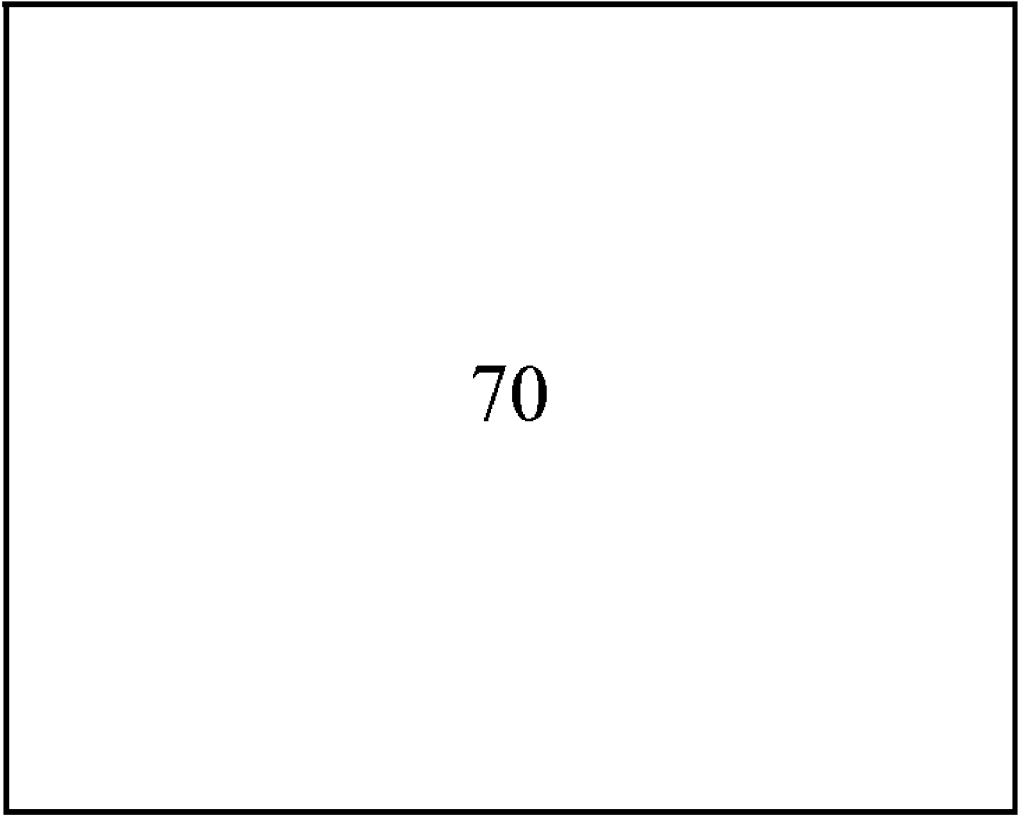
FIG. 7 illustrates a storage medium containing description of one or more electronic circuits implementing one or more of the embodiments of the invention.

In various embodiments, the earlier described memory cells are embodied in an integrated circuit. The integrated circuit may be described using any one of a number of hardware design language, such as but not limited to VHDL or Verilog. The compiled design may be stored in any one of a number of data format, such as but not limited to GDS or GDS II. The source and/or compiled design may be stored on any one of a number of medium such as but not limited to DVD, such as medium 70 illustrated in FIG. 7.

Although specific embodiments have been illustrated and described herein for purposes of description of the preferred embodiment, it will be appreciated by those of ordinary skill in the art that a wide variety of alternate and/or equivalent implementations may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein.

What is claimed is:

1. A digital memory unit, comprising:
    an input/output (I/O) terminal having an I/O driver configured to selectively drive a digital value; and
    a detector coupled to the I/O driver, wherein the detector is configured to:
        detect the digital value;
        compare the digital value with a digital value previously provided to the I/O terminal; and
        conditionally shut off power to the I/O driver based, at least in part, on a result of the comparison of the digital value and the previously provided digital value.

2. The digital memory unit of claim 1, wherein the detector is further configured to shut off power to the I/O driver upon a determination that the result of the comparison indicates that the compared digital values are the same.

3. The digital memory unit of claim 1, wherein the detector comprises a clock toggle switch.

4. The digital memory unit of claim 1, wherein the previously provided digital value immediately precedes the digital value.

5. The digital memory unit of claim 1, wherein the detector comprises a latch configured to hold the previously provided digital value.

6. The digital memory unit of claim 1, wherein the digital value and the previously provided digital value comprise address values.

7. The digital memory unit of claim 1, wherein the digital value and the previously provided digital value comprise data values.

8. The digital memory unit of claim 1, wherein:
    the I/O terminal further comprises a second I/O driver configured to selectively drive a second digital value; and
    the detector is further configured to:
        detect the second digital value;
        compare the second digital value with a second digital value previously provided to the I/O terminal; and
        conditionally shut off power to the second I/O driver based, at least in part, on a result of the comparison of the digital value and the previously provided second digital value.

9. The digital memory unit of claim 1, wherein:
    the I/O terminal further comprises a second I/O driver configured to selectively drive a second digital value;
    the digital memory unit further comprises a second detector; and
    the second detector is coupled to the second I/O driver, wherein the second detector is configured to:
        detect the second digital value;
        compare the second digital value with a second digital value previously provided to the I/O terminal; and
        conditionally shut off power to the second I/O driver based, at least in part, on a result of the comparison of the second digital value and the previously provided second digital value.

10. The digital memory unit of claim 1, further comprising another I/O terminal having at least one other I/O driver, wherein the at least one other I/O driver is configured to drive another digital value, and wherein the detector is further coupled to the at least one other I/O driver to conditionally shut off power to the at least one other I/O driver based, at least in part, on the other digital value.

11. The digital memory unit of claim 1, further comprising another I/O terminal having at least one other I/O driver, wherein the at least one other I/O driver is configured to drive another digital value, and wherein the digital memory unit further comprises another detector coupled to the at least one other I/O driver to conditionally shut off power to the at least one other I/O driver based, at least in part, on the other digital value.

12. The digital memory unit of claim 1, wherein the digital memory unit is a memory bank comprising multiple memory cells, and wherein the I/O terminal is coupled to at least one of the memory cells.

13. A system, comprising:
    a digital memory bank including a plurality of input/output (I/O) terminals and memory cells coupled to the I/O terminals, wherein each I/O terminal has one or more I/O drivers;
    a controller coupled to the digital memory bank and configured to control reads from, and writes to, the digital memory bank; and
    a detector coupled to at least one I/O driver from one of the plurality of I/O terminals, wherein the detector is configured to detect a digital value provided to the one of the I/O terminals, and wherein the detector is further configured to compare the digital value with a digital value previously provided to the I/O terminal and to conditionally shut off power to the at least one I/O driver based, at least in part, on a result of the comparison of the digital value with the previously provided digital value.

14. The system of claim 13, wherein the detector is further configured to conditionally shut off power to the at least one I/O driver if the digital value and the previously provided digital value are the same.

15. The system of claim 13, wherein the digital value and the previously provided digital value comprise address values.

16. The system of claim 13, wherein the digital value and the previously provided digital value comprise data values.

17. The system of claim 13, wherein:
    the detector is further coupled to another I/O driver for the I/O terminals; and
    the detector is further configured to conditionally shut off power to the other I/O driver based, at least in part, on a result of a comparison between another digital value provided to the other I/O driver and another digital value previously provided to the other I/O driver.

18. The system of claim 13, wherein:
    the system further comprises at least one other detector coupled to another I/O driver for at least one of the I/O terminals; and
    the other detector is configured to conditionally shut off power to the other I/O driver based, at least in part, on a result of a comparison between another digital value provided to the other I/O driver and another digital value previously provided to the other I/O driver.

19. An apparatus, comprising:
first means for driving input, or output, of digital values into, or out of, the apparatus; and
second means for detecting a current digital value provided to the first means, for comparing the current digital value with a digital value previously provided to the first means, and for conditionally shutting off power to the first means based, at least in part, on a result of the comparison.

20. The apparatus of claim 19, wherein the digital value is an address value or a data value.

21. A method of operating digital memory, the method comprising:
detecting a digital value provided to an input/output (I/O) terminal; and
conditionally shutting off power to an I/O driver associated with the I/O terminal based, at least in part, on whether the digital value differs from another digital value previously provided to the I/O terminal.

22. The method of claim 21, wherein said conditionally shutting off power to an I/O driver comprises shutting off power to the I/O driver when the digital value and the previously provided digital value are the same.

23. The method of claim 21, further comprising providing the digital value and the previously provided digital value to the I/O terminal.

24. An article of manufacture, comprising a storage medium including a plurality of hardware design language instructions, or a compilation of the hardware design language instructions, wherein the hardware design language instructions are configured to specify an implementation of the digital memory unit as set forth in claim 1 as an integrated circuit.

25. The article of manufacture of claim 24, wherein the hardware design language instructions comprises a selected one of VHDL or Verilog, or wherein the compilation is in GDS format.

26. The digital memory unit of claim 1, wherein the detector is further configured to conditionally shut off power to the I/O driver at some point during a drive operation of the digital value by the I/O driver.

27. The system of claim 13, wherein the detector is further configured to conditionally shut off power to the at least one I/O driver after the at least one I/O driver has begun a drive operation of the digital value.

28. The method of claim 21, wherein said conditionally shutting off power to an I/O driver comprises conditionally shutting off power to the I/O driver after the I/O driver has begun a drive operation and before the I/O driver has completed the drive operation.

29. The system of claim 13, wherein the detector is disposed on either the digital memory bank or the controller.

* * * * *

UNITED STATES PATENT AND TRADEMARK OFFICE
CERTIFICATE OF CORRECTION

| | |
|---|---|
| PATENT NO. | : 7,869,244 B2 |
| APPLICATION NO. | : 12/545730 |
| DATED | : January 11, 2011 |
| INVENTOR(S) | : Rao |

It is certified that error appears in the above-identified patent and that said Letters Patent is hereby corrected as shown below:

Column 10, line 9, in Claim 25, delete "comprises" and insert -- comprise --.

Signed and Sealed this
Tenth Day of May, 2011

David J. Kappos
*Director of the United States Patent and Trademark Office*